(12) United States Patent
Nam

(10) Patent No.: US 10,163,918 B2
(45) Date of Patent: Dec. 25, 2018

(54) SEMICONDUCTOR DEVICE AND METHOD OF MANUFACTURING THE SAME

(71) Applicant: SK hynix Inc., Gyeonggi-do (KR)

(72) Inventor: Sang Hyuk Nam, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/821,394

(22) Filed: Aug. 7, 2015

(65) Prior Publication Data

US 2015/0348980 A1    Dec. 3, 2015

Related U.S. Application Data

(62) Division of application No. 13/597,889, filed on Aug. 29, 2012, now Pat. No. 9,136,274.

(30) Foreign Application Priority Data

Apr. 19, 2012  (KR) .................. 10-2012-0040701

(51) Int. Cl.
| | |
|---|---|
| H01L 21/764 | (2006.01) |
| H01L 27/11521 | (2017.01) |
| H01L 21/28 | (2006.01) |
| H01L 21/3213 | (2006.01) |
| H01L 21/311 | (2006.01) |
| H01L 21/02 | (2006.01) |
| H01L 21/285 | (2006.01) |
| H01L 29/66 | (2006.01) |

(52) U.S. Cl.
CPC .. *H01L 27/11521* (2013.01); *H01L 21/02238* (2013.01); *H01L 21/02381* (2013.01); *H01L 21/02428* (2013.01); *H01L 21/28273* (2013.01); *H01L 21/28525* (2013.01); *H01L 21/31144* (2013.01); *H01L 21/32139* (2013.01); *H01L 21/764* (2013.01); *H01L 29/66825* (2013.01)

(58) Field of Classification Search
CPC ............ H01L 21/764; H01L 21/76205; H01L 21/76202; H01L 21/823481; H01L 21/823878; H01L 29/0649
See application file for complete search history.

(56) References Cited

U.S. PATENT DOCUMENTS 5,937,296 A * 8/1999 Arnold .............. H01L 27/10841
257/E27.096
6,074,930 A * 6/2000 Cho .................. H01L 21/76232
257/E21.549

(Continued)

FOREIGN PATENT DOCUMENTS

| CN | 101276842 | 10/2008 |
| JP | 2009267208 A | * 11/2009 |

(Continued)

*Primary Examiner* — Yu Chen
(74) *Attorney, Agent, or Firm* — IP & T Group LLP

(57) ABSTRACT

A semiconductor device includes a substrate including a plurality of active regions divided by a plurality of trenches, a plurality of tunnel insulating layer patterns formed over the active regions, a plurality of conductive film patterns formed over the tunnel insulating film patterns, a plurality of first isolation layers formed on sidewalls and bottom surfaces of the trenches, and a plurality of second isolation layers formed between the conductive film patterns.

9 Claims, 3 Drawing Sheets

(56) References Cited

U.S. PATENT DOCUMENTS

| | | | |
|---|---|---|---|
| 2002/0135041 A1* | 9/2002 | Kunikiyo | H01L 21/28052 257/510 |
| 2005/0282354 A1 | 12/2005 | Kawasaki et al. | |
| 2007/0037341 A1 | 2/2007 | Rueger et al. | |
| 2007/0045769 A1 | 3/2007 | Bian et al. | |
| 2010/0019311 A1* | 1/2010 | Sato | H01L 21/28273 257/326 |
| 2012/0104491 A1 | 5/2012 | Heineck et al. | |

FOREIGN PATENT DOCUMENTS

| | | |
|---|---|---|
| JP | 2010027922 | 2/2010 |
| KR | 1020050030099 | 3/2005 |
| KR | 100748559 | 8/2007 |

\* cited by examiner

SEMICONDUCTOR DEVICE AND METHOD OF MANUFACTURING THE SAME

CROSS-REFERENCE TO RELATED APPLICATION

This application is a division of U.S. patent application Ser. No. 13/597,889 filed on Aug. 29, 2012, which claims priority to Korean-patent application number 10-2012-0040701 filed on Apr. 19, 2012. The entire disclosure of each of the foregoing application is incorporated herein by reference in its entirety.

BACKGROUND

Exemplary embodiments relate generally to a semiconductor device and a method of manufacturing the same and, more particularly, to a semiconductor device having an air gap, and a method of manufacturing the same.

Recently, as the degree of integration of semiconductor devices has been enhanced, a defective rate of semiconductor devices has been increased. Problems of the related art will be described in detail with reference to FIGS. 1A to 1D.

FIGS. 1A to 1D are cross-sectional views illustrating a method of manufacturing a memory cell of a NAND flash memory device according to the related art. FIGS. 1A to 1D are cross-sectional views of memory cells of a NAND flash memory device taken along gate lines.

Referring to FIG. 1A, a semiconductor layer 101 includes isolation regions where trenches 109 are formed, and active regions A are divided by the trenches 109. A tunnel insulating layer 103 and a first conductive film 105a for a floating gate are stacked on each of the active regions A. The tunnel insulating layer 103 and the first conductive film 105a may remain only under isolation masks 107 that open the regions in which the trenches 109 are to be formed.

Widths of the active regions A and widths of the trenches 109 are reduced as the degree of integration is increased. Thus, the active regions A and the trenches 109 of a semiconductor device having a high degree of integration may be formed to have a very narrow width.

Referring to FIG. 1B, a sufficient amount of an isolation layer 111a is formed on the entire structure so that the trenches 109 are filled. Here, if the interior of the trenches 109 formed to have narrow widths is not fully filled with the isolation layer 111a, air gaps 113 may be generated in the isolation layer 111a within the trenches 109. Here, when the air gaps 113 are formed, the air gaps 113 may be formed to be irregular in position and size in each trench 109, rather than being uniform.

Referring to FIG. 1C, the isolation layer 111a is planarized until the isolation masks 107 are exposed, and the isolation masks 107 are subsequently removed. Subsequently, the height of the isolation layer 111a is lowered through an etching process so that upper sidewalls of the first conductive film 105a are exposed. Accordingly, the isolation layer 111b having a target height is formed. During the etching process performed to adjust the height of the isolation layer 111b as a target height, the air gap 113 may be exposed.

Referring to FIG. 1D, a dielectric film 121 is formed on a surface of the entire structure that includes the isolation layer 111b, and a second conductive film 123 for a control gate is formed on the dielectric film 121. The second conductive film 123 is formed to cover spaces between the first conductive films 105a (shown in FIG. 1C). Thereafter, the second conductive film 123, the dielectric film 121, and the first conductive film 105a are etched through an etching process that uses the gate masks 125 as an etch barrier. Accordingly, the second conductive film 123 is patterned as a gate lines in a direction crossing the active regions A or the isolation layers 111b. The first conductive film 105b remains as a floating gate in the crossing of the gate lines and the active regions A.

In the above, when the dielectric film 121 and the second conductive film 123 are formed, and if the air gap 113 is exposed, the interior of the air gap 113 may be filled with the dielectric film 121 and the second conductive film 123. As a result, during an etching process to form the gate lines, the second conductive film 123 within the air gap 113 may not be removed and the gate lines may be connected, rather than, being separated to cause a defect.

Meanwhile, without the air gap 113, the space between the active region A and the floating gate 105b and the space between the active region A and the second conductive film 123 as a gate line would be filled with the isolation layer 111b. In this case, first capacitance between the active region A and the floating gate 105b and second capacitance between the active region A and the gate line in an adjacent memory cell are determined by permittivity of the isolation layer 111b. The first and second capacitances depending on the permittivity of the isolation layer 111b are increased as the degree of integration is enhanced. Thus, a malfunction rate may be increased due to interference between the active region A and the floating gate 105b and interference between the active region A and the gate line.

BRIEF SUMMARY

Exemplary embodiments relate to a semiconductor device that has a low defective rate and a low malfunction rate, and a method of manufacturing the same.

A semiconductor device according to an exemplary embodiment of the present invention includes a substrate including a plurality of active regions divided by a plurality of trenches, a plurality of tunnel insulating layer patterns formed over the active regions, a plurality of conductive film patterns formed over the tunnel insulating film patterns, a plurality of first isolation layers formed on sidewalls and bottom surfaces of the trenches, and a plurality of second isolation layers formed between the conductive film patterns.

A semiconductor device according to an exemplary embodiment of the present invention includes a substrate including a plurality of active regions divided by a plurality of trenches, a plurality of conductive film patterns formed over the active regions, and a plurality of tunnel insulating layer patterns formed between the active regions and the conductive film patterns and having side walls further protruded than side walls of the conductive film patterns and the active regions.

A method of manufacturing a semiconductor device according to an exemplary embodiment of the present invention includes stacking a tunnel insulating layer and a first conductive film over a substrate including a plurality of alternately disposed first and second regions, etching the first conductive film, the tunnel insulating layer and the second regions of the substrate to form tunnel insulating film patterns and first conductive film patterns over the first regions and to form trenches in the second regions, and forming a isolation structures between the first conductive film patterns and over the surfaces of the trenches to form air gaps within the trenches and between the tunnel insulating film patterns.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Embodiments of the present invention will be described in detail with reference to the accompanying drawings. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIGS. 2A to 2D are cross-sectional views illustrating a semiconductor device and a method of manufacturing the same according to embodiments of the present invention. In particular, FIGS. 2A to 2D are a plan view of a portion of a memory cell region of a NAND flash memory device and a cross-sectional view taken along the dotted line shown on the plan view according to an embodiment of the present invention, respectively.

Figure 1A:
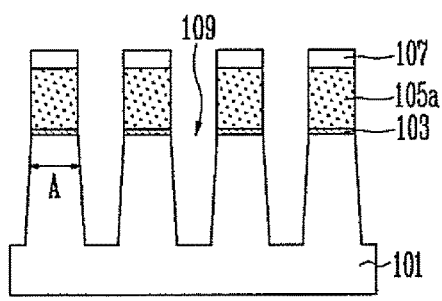
FIGS. 1A to 1D are cross-sectional views illustrating a method of manufacturing a memory cell of a NAND flash memory device according to the related art.
Figure 1B:
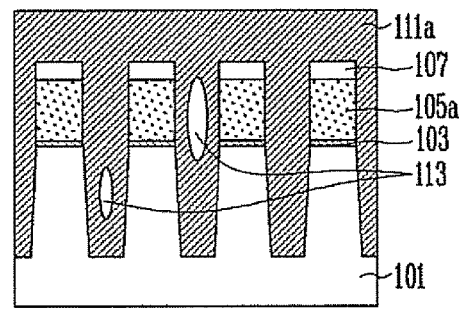
Figure 1C:
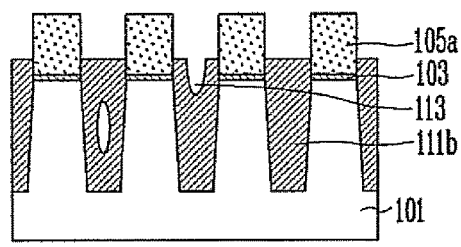
Figure 1D:
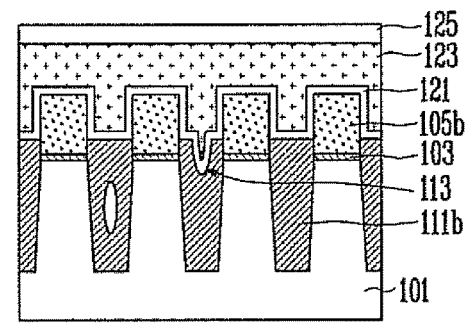
Figure 2A:
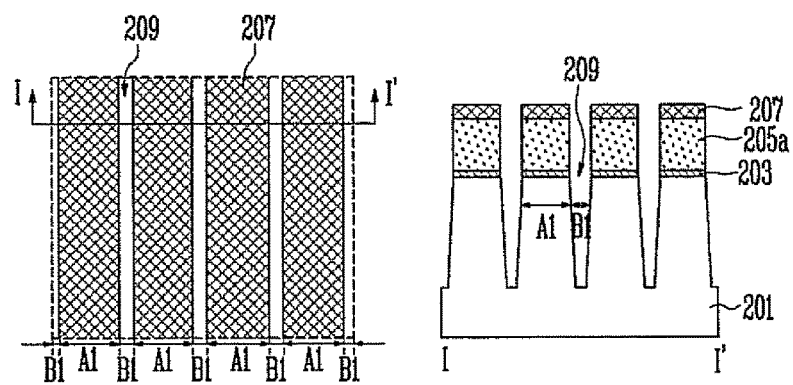
FIGS. 2A to 2D are cross-sectional views illustrating a semiconductor device and a method of manufacturing the same according to embodiments of the present invention.

Referring to FIG. 2A, tunnel insulating layer patterns 203 and first conductive film patterns 205a are formed over first regions A1 of a substrate 201 that includes isolation regions and active regions, and trenches 209 are formed in second regions B1 of the substrate 201. Hereinafter, an example of a process of forming the tunnel insulating layer patterns 203, the first conductive film patterns 205a, and the trenches 209 will be described in detail.

First, a tunnel insulating layer and a first conductive film are sequentially stacked on the substrate 201 that includes the first and second regions A1 and B1, and isolation masks 207 are stacked on the first conductive film.

The substrate 201 may be formed of single crystalline silicon. The first region A1 is a region defined to have a width larger than that of the active region. The first region A1 includes the active region and sides of the active region that are in contact with edges of the isolation regions. The second region B1 is a region defined to have a width shorter than that of the isolation region of the substrate 201. The second region B1 is a portion of the isolation region. The second regions B1 divide the first regions A1. The first region A1 may be defined to have a width larger than that of the second region B1. The active regions of the substrate 201 are regions separated by the isolation regions. In the region where memory cells are formed, the active regions and the isolation regions may be disposed to be parallel in one direction. Also, in the region where memory cells are formed, the active regions and the isolation regions may be alternately disposed. A disposition of the first regions A1 and the second regions B1 may be determined based on a disposition of the active regions and the isolation regions. Thus, in the region in which memory cells are formed, the first regions A1 and the second regions B1 may be alternately disposed to be parallel in one direction.

For example, a tunnel insulating layer may be made of an oxide such as a silicon oxide or an oxy-nitride such as a silicon oxy-nitride. Alternatively, in order to improve a bird's beak phenomenon of the tunnel insulating layer, a nitride film may be formed before and after an oxide film is formed to allow the tunnel insulating layer to have a stack structure that includes a nitride film, an oxide film, and a nitride film.

The first conductive film may be formed of a polysilicon film. The polysilicon film may be a single film of undoped polysilicon, a single film of doped polysilicon, or stacked films of undoped polysilicon and doped polysilicon. In the case of the NAND flash memory device, the first conductive film may be used as a floating gate film storing electric charges.

The isolation masks 207 are formed to block the first regions A1 and expose the second regions B1. An opening between the isolation masks 207 may be formed to expose the isolation region. Here, a width of the opening may be shorter than the width of the isolation region. The isolation mask 207 has a width greater than the width of the active region and may block the active region and edges of each of the isolation regions at both sides of the active region. The isolation mask 207 may be formed of a nitride film or an oxide film After the isolation masks 207 are formed, the first conductive film, the tunnel insulating layer, and the second regions B1 exposed through the isolation masks 207 are etched. Accordingly, the tunnel insulating layer patterns 203 and the first conductive patterns 205a are formed over the first regions A1. The trenches 209 are formed in the second regions B1. The tunnel insulating layer pattern 203 and the first conductive film pattern 205a may have a width greater than that of the active region and may be formed over the active region and edges of each of the isolation regions. The trench 209 may have a width shorter than that of the isolation region and formed in the isolation region.

Figure 2B:
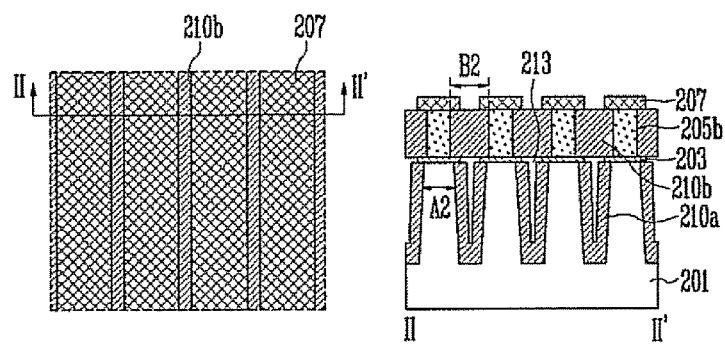

Referring to FIG. 2B, isolation layers 210a and 210b are formed on the surface of the first region A1 exposed through the trench 209 and between the first conductive film patterns 205a. Air gaps 213 are formed within the trenches 209 and between the tunnel insulating layer patterns 203. In order to form the air gaps 213, oxidation may be performed in a state that the trenches 209 and the sidewalls of the first conductive film patterns 205a (shown in FIG. 2A) are exposed. Here, portions of the substrate 201 and the first conductive film patterns 205a exposed through the trenches 209 are oxidized, and an oxide film grows on the oxidized region.

For example, oxidation may be performed at a temperature between 700° C. and 800° C. by mixing $H_2$ gas and $O_2$ gas in a ratio of 1:1. Under such conditions, an oxidation speed of polycrystalline silicon is faster than that of single crystalline silicon, and an oxide film grows faster on a region where polycrystalline silicon was oxidized than a region where single crystalline silicon was oxidized. In the exemplary embodiment of the present invention, the substrate 201 exposed through the trench 209 may be formed of single crystalline silicon, while the first conductive film pattern 205a may be formed of polycrystalline silicon. Thus, the exposed surface of the first conductive film pattern 205a is oxidized to be thicker than the surface of the substrate 201 exposed through the trench 209, so the width of the second region A2, which is non-oxidized, is greater than the width of the first conductive film pattern 205b, which is non-oxidized. Also, an oxide film grows faster on the oxidized region of the first conductive film pattern 205a than on the oxidized region of the substrate 201, thus, a space between the first conductive film patterns 205a is covered with the oxide film before the trench 209 is covered with the oxide film. The first isolation layer 210a is formed on the exposed surface of the trench 209 and the second isolation layer 210b is formed between the first conductive film patterns 205b through the foregoing oxidation. Also, before the trench 209 is covered with the first isolation layer 210a, a space between the first conductive film patterns 205b is first covered by the second isolation layer 210b to block the opening of the trench 209. Accordingly, the air gap 213 may be formed within the trench 209.

The first isolation layer 210a includes a partially oxidized portion of the first region A1 of the substrate 201 and an oxide film grown on the oxidized first region A1. The second isolation layer 210b includes an oxidized portion of a sidewall of the first conductive film pattern 205a and an oxide film grown on the oxidized sidewall of the first conductive film pattern 205a. A portion of the first region A1 that has not been oxidized forms the active region A2. The oxidized portion of the first region A1 and the region where the trench 209 is present form the isolation region B2.

The first conductive film pattern 205b, which has not been oxidized but remains on the active region A2, may be used as a gate line or a floating gate. The remaining tunnel insulating layer pattern 203 may have a width greater than that of the first conductive film pattern 205b or that of the active region A2. In other words, the sidewall of the tunnel insulating layer pattern 203 may be further protruded than the sidewall of the active region A2 or the sidewall of the first conductive film pattern 205b.

The isolation mask 207 may prevent a top surface of the first conductive film pattern 205a from being oxidized during the foregoing oxidation. Also, in the exemplary embodiment of the present invention, a space between the first conductive film patterns 205a is filled with the second isolation layer 210b through oxidation, rather than being filled by depositing an oxide film. Compared to a case that a particular space is filled by depositing an oxide film, it is easy to control uniformly an amount of oxide film formed within a particular space when the particular space is filled with an oxide film formed through oxidation. Thus, in the exemplary embodiment of the present invention, because the second isolation layer 210b is formed through oxidation, the second isolation layer 210b may be uniformly formed in each space between the first conductive film patterns 205a.

In the exemplary embodiment of the present invention, because the first and second isolation layers 210a and 210b are formed through oxidation, the formation positions of the first and second isolation layers 210a and 210b may be uniformly controlled. Accordingly, the position of the air gap 213 formed between the first and second isolation layers 210a and 210b may be uniformly controlled.

Figure 2C:
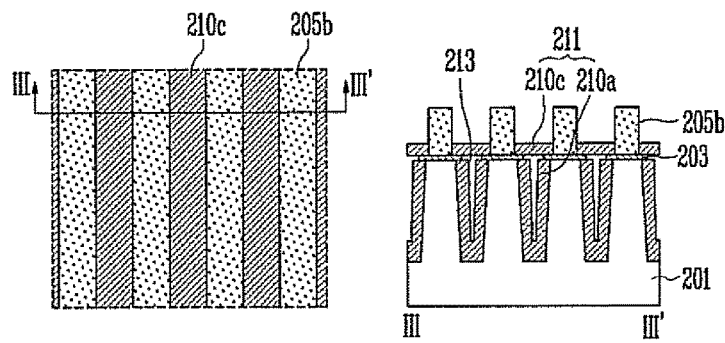

Referring to FIG. 2C, after the isolation mask 207 is removed, the second isolation layer 210b (shown in FIG. 2B) is etched to have a predetermined height in order to prevent interference between memory cells. Thus, sidewalls of the first conductive film pattern 205b are exposed. An effective field oxide height (EFH) of the isolation structure 211 may be determined by the height of the remaining second isolation layer 210c after the etching process.

If the isolation mask 207 is formed of an oxide film, then the isolation mask 207 may be removed by using a process of etching the second isolation layer 210b, thus, an additional process of removing the isolation mask 207 may not be necessary.

In the exemplary embodiment of the present invention, the air gap 213 is controlled uniformly below the remaining second isolation layer 210c. Thus, the air gap 213 is not exposed by the remaining second isolation layer 210c even when an etching process for adjusting EFH is performed.

In the exemplary embodiment of the present invention, the second isolation layer 210b is formed only between the first conductive film patterns 205b through oxidation. In comparison, if the trench 209 and a space between the first conductive film patterns 205b are filled with an oxide film through an oxide film deposition process, then the oxide film may be formed to have a thickness enough to fill the trench 209 and the space between the first conductive film patterns 205b. Thus, in the case of using the oxide film deposition process, the oxide film is formed even on the trench 209 as well as the space between the first conductive film patterns 205b. As a result, in comparison to the case of controlling the EFH by removing the oxide film formed through the oxide film deposition process, an amount of etching of the oxide film may be reduced if the EFH is controlled by removing the second isolation layer 210b formed through oxidation according to the exemplary embodiment of the present invention. Thus, the amount of etching of the second isolation layer 210b of each of the isolation regions B2 (shown in FIG. 2D) may be adjusted to make the EFH of the isolation structure 211 of each of the isolation regions B2 uniform.

Figure 2D:
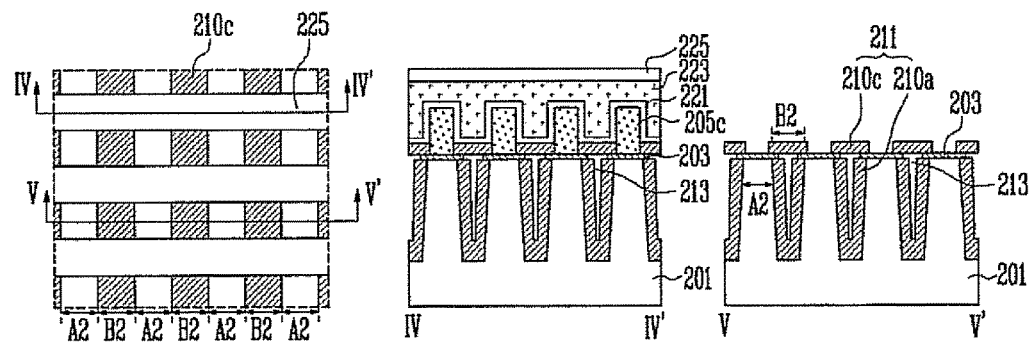

Referring to FIG. 2D, in the case of the NAND flash memory device, after a dielectric film 221 is formed on the surface of the entire structure that includes the isolation structure 211 (shown in FIG. 2C), a second conductive film 223 and gate masks 225 may be further stacked on the dielectric film 221.

For example, the dielectric film 221 may be formed as an ONO film that includes oxide film/nitride film/oxide film. Alternatively, the dielectric film 221 may be formed by using a metal oxide having high permittivity in order to increase capacitance. The metal oxide that has high permittivity may include hafnium oxide, titanium oxide, tantalum oxide, zirconium oxide, aluminum oxide, and the like.

The second conductive film 223 may be formed by using, for example, a doped polysilicon, metal, metal oxide, metal silicide, or the like, as a control gate film of the NAND flash memory device. The air gap 213 according to the exemplary embodiment of the present invention is blocked by the remaining second isolation layer 210c, so the second conductive film 223 may not infiltrate into the air gap 213 when the second conductive film 223 is formed. Thus, in the exemplary embodiment of the present invention, an occurrence of a phenomenon that the gate lines are not separated by the second conductive film 223 that remains within the air gap 213 may be prevented, and as a result, a defect of the semiconductor device may be prevented.

The gate masks 225 may be formed by using, for example, a silicon oxide, a silicon nitride, or a silicon oxy-nitride. The gate masks 225, which are patterns defining regions where gate lines are subsequently formed, may be formed as line patterns that follow a direction crossing the active regions A2 and the isolation regions B2.

Subsequently, the second conductive film 223, the dielectric film 221, and the first conductive film patterns 205b of the region exposed through the gate masks 225 are etched. Accordingly, the second conductive film 223 is patterned as gate lines that follow the direction crossing the active regions A2 or the isolation structure 211. The first conductive film patterns 205c remain in the crossing of the gate lines and the active regions A2 to be used as floating gates.

Hereinafter, structural characteristics of the semiconductor device according to the exemplary embodiment of the present invention will be described.

As illustrated in FIG. 2D, the semiconductor device according to the exemplary embodiment of the present invention includes a plurality of active regions A2 divided by the trenches formed in the isolation regions B2, the tunnel insulating layer patterns 203 formed on the active regions A2, and the first conductive film patterns 205c formed on the tunnel insulating layer patterns 203. The first conductive film patterns 205c may be floating gates of the NAND flash memory device or gate lines of the semiconductor device.

The first isolation layer 210a, the remaining second isolation layer 210c, and the air gap 213 extending in the same direction as the direction in which the active region A2 extends are formed in the isolation region B2 of the semiconductor device. The first isolation layer 210a is formed on the sidewalls and a bottom surface of the trench so that an opening is formed in the space between the active regions A2. The second isolation layer 210b, which later becomes the remaining second isolation layer 210c, is formed to cover a space between the first conductive film patterns 205c to block an opening between the active regions A2. The air gap 213 is formed between the first and second isolation layers 210a and 210b.

The sidewalls of the tunnel insulating layer pattern 203 may be further protruded than the sidewall of the first conductive film pattern 205c or the active region A2. The first and remaining second isolation layers 210a and 210c may be formed to be spaced apart with the tunnel insulating layer pattern 203 interposed therebetween. Each of the air gaps 213 has a T-shaped cross-section taken in a direction crossing the active regions A2.

In the case of the NAND flash memory device, the dielectric film 221 and the second conductive film pattern 223 patterned as the gate line may be further stacked on the entire structure that includes the first conductive film pattern 205c and the remaining second isolation layer 210c. Here, the first conductive film pattern 205c may be formed to be further protruded above the substrate 201 than the remaining second isolation layer 210c, to increase a facing area of the first conductive film pattern 205c and the second conductive film pattern 225. The second conductive film pattern 225, which is a gate line of the NAND flash memory device, may be formed as a line pattern in a direction crossing the active region A2. The first conductive film pattern 205c may be formed as a floating gate of the NAND flash memory device in the crossing of the active layer A2 and the second conductive film pattern 225.

The shape and position of the air gap 213 are determined by the first and remaining second isolation layers 210a and 210c. The first and remaining second isolation layers 210a and 210c include the oxidized portion of the first conductive film and the substrate, and the oxide film grown on the oxidized portion of the first conductive film and the substrate, so the position and thickness thereof may be controlled quantitatively. Thus, the shape and position of the air gap 213 may be formed uniformly in each isolation regions B2. In particular, the air gap 213 according to the exemplary embodiment of the present invention extend from a space between the active regions A2 to a space between the tunnel insulating layer patterns 203, to be uniformly formed in each of the isolation regions B2. The air gap 213 is a portion formed as being filled with air with permittivity lower than that of the oxide film. Thus, by disposing the air gap 213 between the first conductive film pattern 205c (floating gate) and the active region A2, capacitance between the first conductive film pattern 205c and the active region A2 and between the first conductive film pattern 205c and the second conductive film pattern 223 may be reduced. As a result, electrical interference between the first conductive film pattern 205c and the active region A2 and between the first conductive film pattern 205c and the second conductive film pattern 223 as a gate line, may be reduced, and thus a malfunction rate of the semiconductor device may be reduced.

Figure 3:
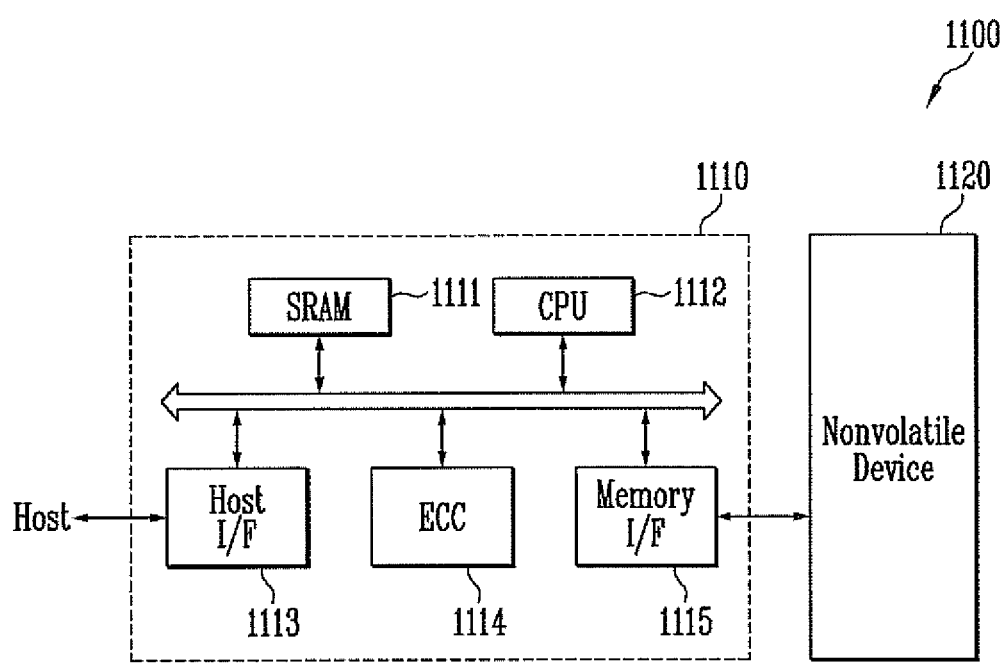
FIG. 3 is a view illustrating a configuration of a memory system according to an embodiment of the present invention.

FIG. 3 is a view illustrating a configuration of a memory system according to the exemplary embodiment of the present invention.

Referring to FIG. 3, a memory system 1100 according to the exemplary embodiment of the present invention includes a non-volatile memory device 1120 and a memory controller 1110.

The non-volatile memory device 1120 includes a non-volatile memory device manufactured based on the method described above with reference to FIGS. 2A through 2D. Also, the non-volatile memory device 1120 may be a multi-chip package that includes a plurality of flash memory chips.

The memory controller 1110 may control the non-volatile memory device 1120, and may include an SRAM 1111, a CPU 1112, a host interface 1113, an ECC 1114, and a memory interface 1115. The SRAM 1111 may be used as an operating memory of the CPU 1112. The CPU 1112 performs a general control operation for exchanging data of the memory controller 1110, and the host interface 1113 includes a data exchange protocol of a host connected to the memory system 1100. Also, the ECC 1114 detects and corrects an error included in data read from the non-volatile memory device 1120, and the memory interface 1115 performs interfacing with the non-volatile memory device 1120. Besides, the memory controller 1110 may further include an RCM storing code data for interfacing with a host, and the like.

The memory system 1100 may be a memory card or a solid state disk (SSD) in which the non-volatile memory device 1120 and the controller 1110 are combined. For example, if the memory system 1110 is an SSD, the memory controller 1110 may communicate with the outside (e.g., a host) through one of various interface protocols such as USB, MMC, PCI-E, SATA, PATA, SCSI, ESDI, IDE, and the like.

As described above, a defective rate and a malfunction rate of the semiconductor device may be reduced through an air gap.

While the present invention has been shown and described in connection with the embodiments, it will be apparent to those skilled in the art that modifications and variations can be made without departing from the spirit and scope of the invention as defined by the appended claims.

What is claimed is:

1. A method of manufacturing a semiconductor device, the method comprising:
stacking a tunnel insulating layer and a first conductive film over a substrate including a plurality of alternately disposed first and second regions, wherein the substrate is formed of a single crystalline silicon;

etching the first conductive film, the tunnel insulating layer and the second regions of the substrate to form tunnel insulating film patterns and first conductive film patterns over the first regions and to form trenches in the second regions, wherein the first conductive film is formed of a polycrystalline silicon; and simultaneously forming first isolation layers and second isolation layers over the surfaces of the trenches which expose a portion of the substrate and between the first conductive film patterns to form air gaps within the trenches by an oxidation process using a mixture of $H_2$ gas and $O_2$ gas, wherein the second isolation layers grow faster than the first isolation layers, wherein first and second isolation layers of the plurality of first and second isolation layers are formed to make the air gaps in spaces surrounded by the first and second isolation layers, and wherein each of the air gaps has a T-shaped cross-section taken in a direction crossing active regions of the substrate.

2. The method of claim 1, wherein the oxidation process is performed at a temperature between 700° C. and 800° C. by mixing the $H_2$ gas and the $O_2$ gas in a ratio of 1:1.

3. The method of claim 1, wherein the first isolation layers are formed along surfaces of the first regions, and the second isolation layers are spaced apart from the first isolation layers and formed between the first conductive film patterns.

4. The method of claim 3, wherein the first isolation layers include an oxidized portion of the first regions and an oxide film grown on the oxidized portion of the first regions.

5. The method of claim 3, wherein the second isolation layers include an oxidized portion of sidewalls of the first conductive film patterns and an oxide film grown on the oxidized portion of the sidewalls of the first conductive film patterns.

6. The method of claim 1, wherein the forming of the trenches comprises:

forming isolation masks to block the first regions and open the second regions; and etching the first conductive film, the tunnel insulating layer, and the substrate in regions opened by the isolation masks.

7. The method of claim 6, further comprising:

removing the isolation masks after the forming of the first and second isolation layers.

8. The method of claim 1, further comprising:

after the forming of the first and second isolation layers, forming a dielectric film over the surfaces of the second isolation layers and the first conductive film patterns;

forming a second conductive film over the dielectric film;

forming gate masks in a direction crossing the first regions over the second conductive film; and etching the second conductive film, the dielectric film, and the first conductive film patterns of the regions exposed through the gate masks.

9. The method of claim 1, further comprising:

after the forming of the first and second isolation layers, etching the second isolation layers so that sidewalls of the first conductive film patterns are exposed.

* * * * *